(12) United States Patent
Yu et al.

(10) Patent No.: US 7,733,151 B1
(45) Date of Patent: Jun. 8, 2010

(54) OPERATING CLOCK GENERATION SYSTEM AND METHOD FOR AUDIO APPLICATIONS

(75) Inventors: Shawn Xianggang Yu, Austin, TX (US); Terry L. Sculley, Lewisville, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/316,166

(22) Filed: Dec. 8, 2008

(51) Int. Cl.
*H03K 3/00* (2006.01)

(52) U.S. Cl. .................. 327/291; 327/156

(58) Field of Classification Search .......... None
See application file for complete search history.

(56) References Cited

U.S. PATENT DOCUMENTS

| | | | |
|---|---|---|---|
| 7,200,093 B2 * | 4/2007 | Hsiao et al. ............ 369/59.19 |
| 7,262,716 B2 | 8/2007 | Yu et al. ................... 341/61 |
| 7,408,485 B1 | 8/2008 | Yu et al. ................... 341/61 |
| 7,432,750 B1 * | 10/2008 | Sidiropoulos et al. ...... 327/156 |
| 2005/0017772 A1 * | 1/2005 | Hsiao et al. .............. 327/156 |
| 2005/0093593 A1 * | 5/2005 | Fukuzawa et al. .......... 327/156 |
| 2008/0111597 A1 * | 5/2008 | Cranford et al. ........... 327/156 |

* cited by examiner

*Primary Examiner*—Cassandra Cox
(74) *Attorney, Agent, or Firm*—John J. Patti; Wade J. Brady, III; Frederick J. Telecky, Jr.

(57) ABSTRACT

A clock signal generator (1) includes a phase locked loop (PLL) circuit (25) which requires a reference clock signal of at least a predetermined first frequency ($f_{DIGCLK}$). A first clock signal (REFCLK) of a second frequency ($f_{REF}$) that is substantially lower than the first frequency ($f_{DIGCLK}$) is multiplied so as to produce a second clock signal (DIGCLK) which has a frequency at least as high as the first frequency ($f_{DIGCLK}$) and which is phase-locked with respect to the first clock signal (REFCLK). The second clock signal (DIGCLK) is applied to a reference signal input of the PLL circuit (25), which produces an output clock signal (PLLCLK or CLKOUT).

20 Claims, 5 Drawing Sheets

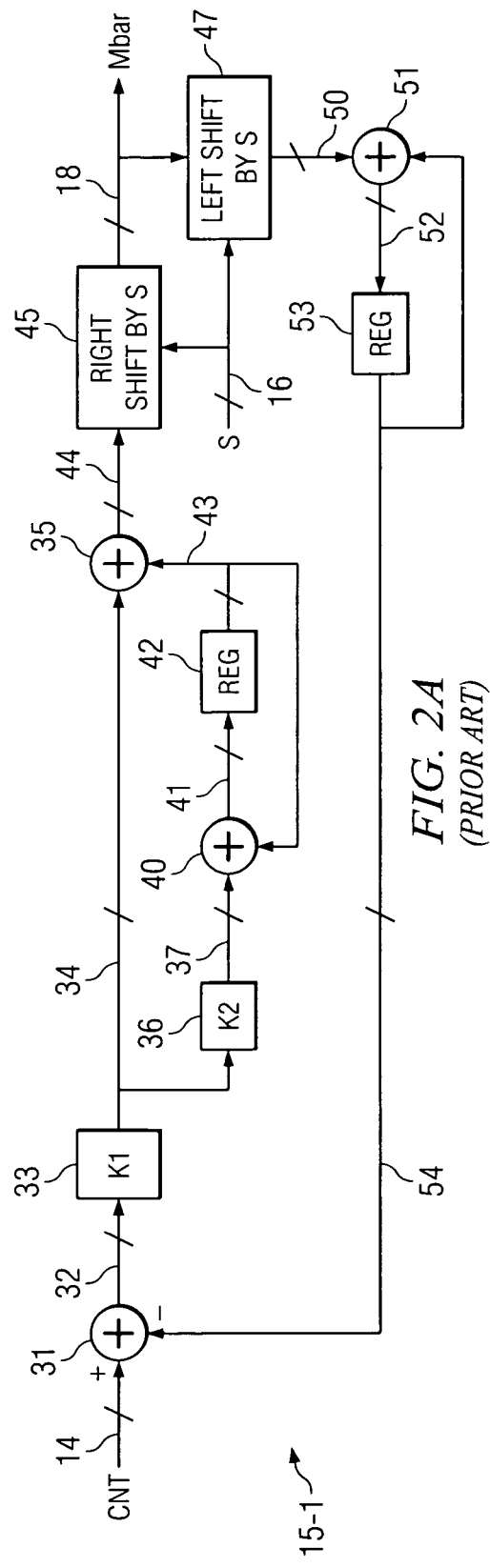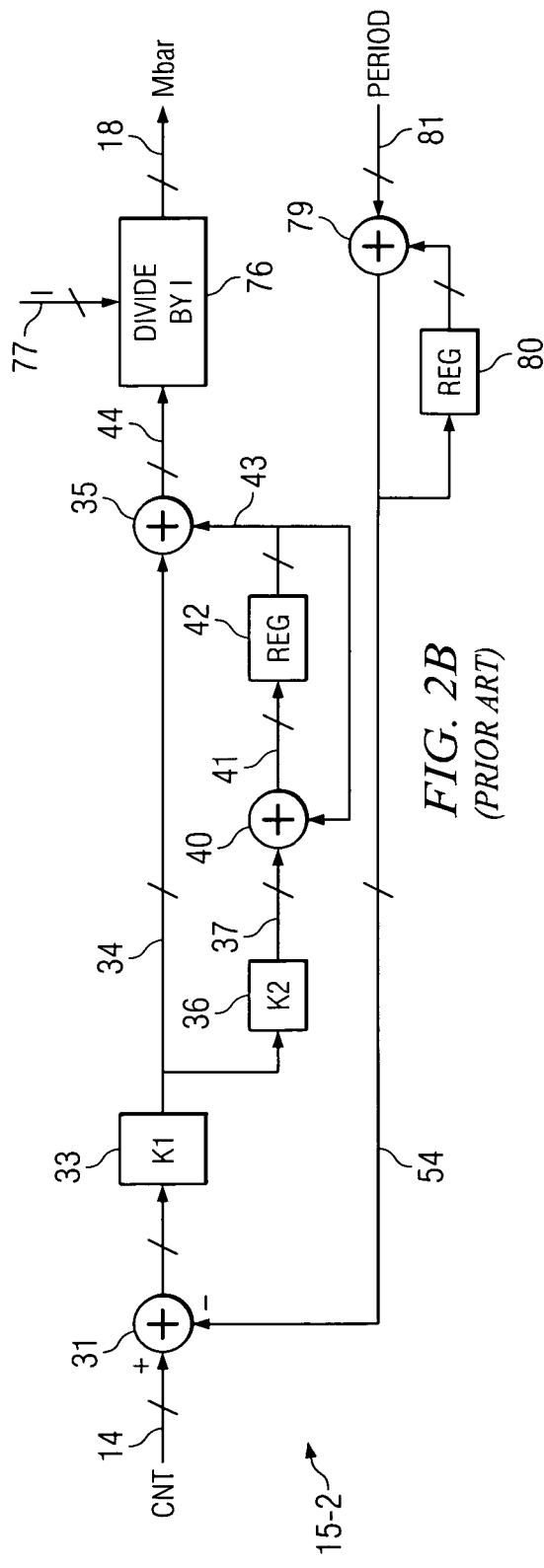
*FIG. 2A (PRIOR ART)*
*FIG. 2B (PRIOR ART)*

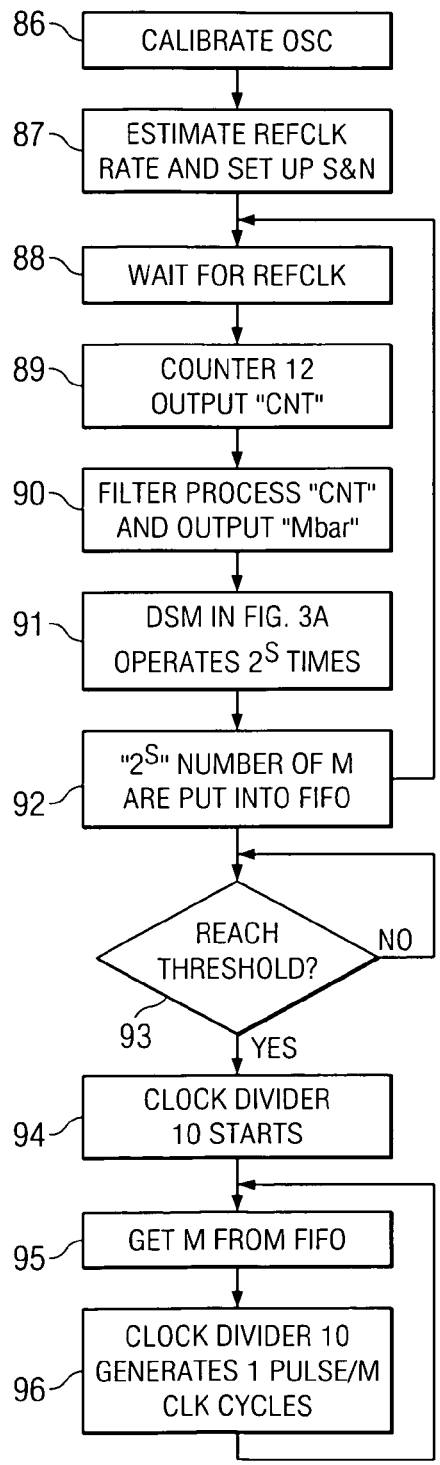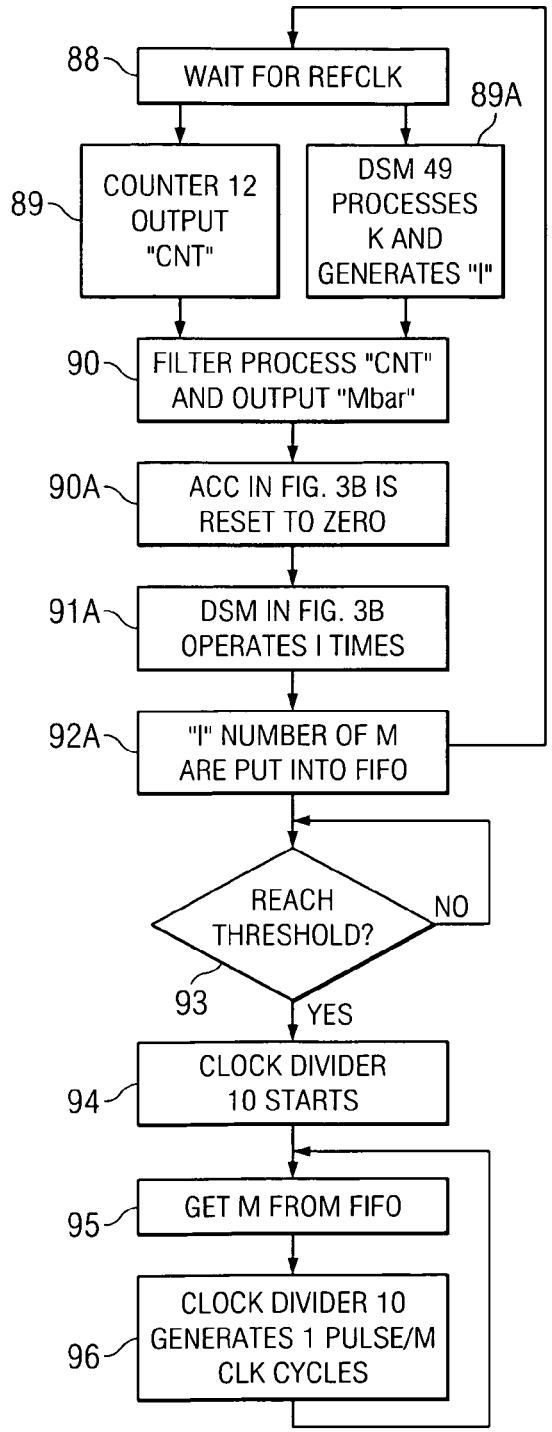
*FIG. 4A*       *FIG. 4B*

OPERATING CLOCK GENERATION SYSTEM AND METHOD FOR AUDIO APPLICATIONS

BACKGROUND OF THE INVENTION

The present invention relates generally to audio frequency clock generation systems, especially for use in audio DAC systems which can replay digital audio data in analog format, for example by decoding it from compressed MP3 format or by receiving it in PCM (pulse code modulation) format supplied by a digital signal processor (DSP).

Audio digital to analog converters (DACs) are widely used in various applications, such as cell phones and MP3 players, wherein the digital audio samples are played back by means of speakers and/or headphones. Because audio signals are typically are stored and processed in digital format, the number of applications of audio DACs are increasing. Normally, a digital signal processor performs a decoding if the original audio data are compressed, and then processes and transfers the decoded and processed audio data to the audio DAC continuously at the audio data sampling rate. The audio DAC receives the audio data and plays it at a rate derived from the externally provided operating clock rate. Typically, the operating clock rate is 512, 256 or 128 times the audio sampling rate.

Since audio signals typically are presented in one of several digital formats, digital and mixed digital/analog audio converting and processing circuits are widely used. High frequency clocks (e.g., tens of MHz) are essential to enable those digital and mixed digital/analog circuits to operate. In many cases, the operating clock frequencies are required to be exponential multiples (i.e., powers of 2) of the audio sampling rates of the digital and mixed digital/analog audio converting and processing circuits.

There are two ways to reproduce digital speech and audio data. One way is to use a sample rate converter, as described in the assignee's U.S. Pat. No. 7,262,716 issued Aug. 20, 2007 and U.S. Pat. No. 7,408,485 issued Aug. 5, 2008. Another way is to play back the digital audio data with the clock synchronized to, or with the clock output sampling rate the same as, the input sampling rate used when the digital audio speech and audio data was recorded. In that case a sample rate converter is not needed, and it is necessary to generate an output sample rate clock having a frequency which is proportional to the input sample rate at which the original audio data was recorded. This is generally accomplished by using an external reference clock and a PLL to multiply that reference clock either by an integer or by a fractional number in order to generate an output clock signal having the needed output audio sampling frequency proportional to the original input sample rate. But if the reference clock is too slow for the PLL, it is likely to become unstable.

There are several ways of generating such clock signals. One way is to use a crystal oscillator which generates a fixed-frequency clock signal. One main advantages of using a crystal oscillator is that the clock signals based thereon tend to have low jitter. Another advantage is that no external reference clock signal is needed. However, a disadvantage of using a crystal oscillator is that the clock signal frequency is fixed, whereas an adjustable-frequency clock signal may be needed.

As previously indicated, another way of generating clock signals of the desired frequency for digital and mixed digital/analog circuits is to use a phase locked loop (PLL) and an external reference clock signal to generate a clock of the desired frequency. A PLL has a particular "tuning range" within which the frequency of the reference clock can be adjusted. However, the PLL performance deteriorates when the reference clock frequency is outside of its tuning range, especially for a reference clock frequency below roughly 1 kHz, to a point at which the PLL can not function normally. The performance deterioration referred to may include increased clock jitter and "wobble" of the clock frequency as the jitter becomes worse.

A clock filtering and clock divide ratio estimator circuit which is shown in subsequently described "Prior Art" FIG. 2A is similar to the loop filter 71 in FIG. 4A of the assignee's U.S. Pat. No. 7,408,485 entitled "ASYNCHRONOUS SAMPLING RATE CONVERTER AND METHOD FOR AUDIO DAC", issued on Aug. 5, 2008, and incorporated herein by reference. Further details of a similar loop filter are shown in FIG. 2 of the assignee's U.S. Pat. No. 7,262,716, entitled "ASYNCHRONOUS SAMPLE RATE CONVERTER AND METHOD", issued Aug. 20, 2007, and also incorporated herein by reference.

There is an unmet need for a low jitter clock signal generating system which produces a high frequency clock signal based on a relatively low frequency reference clock signal.

There also is an unmet need for a clock signal generating system which produces an adjustable high frequency, low jitter clock signal based on a relatively low frequency reference clock signal.

There also is an unmet need for a clock signal generating system which does not utilize a sample rate converter and which produces an adjustable high frequency, low jitter clock signal based on a relatively low frequency reference clock signal and a phase locked loop (PLL).

There also is an unmet need for a clock signal generating system which does not utilize a sample rate converter and which produces an adjustable high frequency, low jitter clock signal based on a relatively low frequency reference clock signal and a phase locked loop (PLL), wherein the phase of the adjustable high frequency, low jitter clock signal is locked relative to the phase of the low frequency reference clock signal.

There also is an unmet need for a clock signal generating system which can generate high frequency clock signals with fine granularity frequency adjustment for a wide range of low reference clock frequencies.

SUMMARY OF THE INVENTION

It is an object of the invention to provide a low jitter clock signal generating system which produces a high frequency clock signal based on a relatively low frequency reference clock signal.

It is another object of the invention to provide a clock signal generating system which produces an adjustable high frequency, low jitter clock signal based on a relatively low frequency reference clock signal.

It is another object of the invention to provide a clock signal generating system which does not utilize a sample rate converter and which produces an adjustable high frequency, low jitter clock signal based on a relatively low frequency reference clock signal and a phase locked loop (PLL).

It is another object of the invention to provide a clock signal generating system which does not utilize a sample rate converter and which produces an adjustable high frequency, low jitter clock signal based on a relatively low frequency reference clock signal and a phase locked loop (PLL), wherein the phase of the adjustable high frequency, low jitter clock signal is locked relative to the phase of the low frequency reference clock signal.

It is another object of the invention to provide a clock signal generating system which can generate high frequency clock signals with fine granularity frequency adjustment for a wide range of low reference clock frequencies.

Briefly described, and in accordance with one embodiment, the present invention provides a clock signal generator (1) which includes a phase locked loop (PLL) circuit (25) which requires a reference clock signal of at least a predetermined first frequency ($f_{DIGCLK}$). A first clock signal (REFCLK) of a second frequency ($f_{REF}$) that is substantially lower than the first frequency ($f_{DIGCLK}$) is digitally (or primarily digitally) multiplied so as to produce a second clock signal (DIGCLK) which has a frequency at least as high as the first frequency ($f_{DIGCLK}$) and which is phase-locked with respect to the first clock signal (REFCLK). The second clock signal (DIGCLK) is applied to a reference signal input of the PLL circuit (25), which produces an output clock signal (PLLCLK or CLKOUT).

In a described embodiment, the invention provides a clock signal generating system (1,1-1,2) for generating an output clock signal (PLLCLK or CLKOUT), including a phase locked loop (PLL) circuit (25) which requires a reference clock signal of at least a predetermined first frequency ($f_{DIGCLK}$). An output of the PLL circuit (25) is coupled to generate the output clock signal (PLLCLK or CLKOUT). A clock signal multiplication circuit (25-1) has an input coupled to receive a first clock signal (REFCLK) of a second frequency ($f_{REF}$) that is substantially lower than the first frequency ($f_{DIGCLK}$) and produces a second clock signal (DIGCLK) which has a frequency at least as high as the first frequency ($f_{DIGCLK}$). The output clock signal (CLKOUT) is phase-locked with respect to the first clock signal (REFCLK). A conductor (24) couples the second clock signal (DIGCLK) to a reference clock input of the PLL circuit (25).

In a described embodiment, the clock signal multiplication circuit (25-1) includes an oscillator (6) and a counter circuit (12) clocked by an oscillator clock signal (CLK) produced by the oscillator (6). The counter circuit (12) samples its contents in response to the first clock signal (REFCLK). The clock signal multiplication circuit (25-1) also includes a clock filter and clock period estimator circuit (15-1) coupled to receive the sampled contents (CNT) of the counter circuit (12). A first delta-sigma modulator (20-1) is coupled to receive an estimate (Mbar) which is representative of the period of the first clock signal (REFCLK) multiplied by a ratio (K) of the first frequency ($f_{DIGCLK}$) to the second frequency ($f_{REF}$), and which is produced by the clock filter and clock period estimator circuit (15-1). The delta-sigma modulator produces an integer representation (M) of the estimate (Mbar). A memory (22) receives a predetermined number of the integer representations (M), and a first divider circuit (10) is coupled to divide the oscillator clock signal (CLK) by the integer representations (M) the predetermined number of times.

In a described embodiment, the clock signal generating system includes set up logic (13) for providing a shift factor (S) for the clock filter and clock period estimator circuit (15-1) and a PLL multiplier factor (N) for the PLL circuit (25) in response to the sampled contents (CNT). The memory includes a first in, first out (FIFO) circuit (22) coupled between an output of the first delta-sigma modulator (20-1) and a divide input of the first divider circuit (10). The clock filter and clock period estimator circuit (15-1) includes low pass filtering and period estimating circuitry.

In one embodiment, the clock filter and clock period estimator circuit (15-1) includes a right-shift circuit (45) having an input (16) coupled to receive the shift factor (S), and an output (18) on which the estimate (Mbar) is produced. A left-shift circuit (47) has an input coupled to receive the estimate (Mbar), another input coupled to receive the shift factor (S), and an output (50) coupled by an accumulator circuit (51,53) to a digital summer (31) which also receives the sampled contents (CNT). The delta sigma modulator (20-1) performs $2^S$ operations on the estimate (Mbar), wherein S is the shift factor.

In one embodiment, the oscillator is a free-running oscillator, and calibration circuitry (4) initially calibrates the oscillator (6) to a predetermined frequency and then allows the oscillator (6) to run freely.

In the described embodiments, the first delta sigma modulator (20-1) has an architecture which ensurers that the second clock signal (DIGCLK) is phase-locked with respect to the first clock signal (REFCLK). In one embodiment, a second clock divider (27) has an input coupled to an output (26) of the PLL circuit (25) and an output on which the output clock signal (CLKOUT) is produced. In one embodiment, the oscillator (6) is a programmable ring oscillator which receives a first control value (SETTING) that sets a nominal frequency of the oscillator clock signal (CLK) which, after being divided by the first divider circuit (10), can be tolerated by the PLL circuit (25). In one embodiment, a second delta-sigma modulator (49) operates on a second control value (K) to produce a digital value (I) which is provided as a frequency multiplier factor input to the clock filter and clock period estimator circuit (15-2).

In one embodiment, the delta sigma modulator (20-2) includes an accumulator (83) having an input coupled to an output of a quantizer (75) which generates the integer representations (M), and another input coupled to an accumulator reset signal (ACC_RESET). An output of the accumulator provides an estimate (PERIOD) of the period of the first clock signal (REFCLK), the estimate of the period being applied to a phase feedback accumulator input (29) of the clock filter and clock period estimator circuit (15-2).

In one embodiment, the invention provides a method for generating an output clock signal (PLLCLK or CLKOUT), including providing a phase locked loop (PLL) circuit (25) which requires a reference clock signal of at least a predetermined first frequency ($f_{DIGCLK}$) and producing the output clock signal (PLLCLK or CLKOUT) in response to an output of the PLL circuit (25), and providing a first clock signal (REFCLK) of a second frequency ($f_{REF}$) that is substantially lower than the first frequency ($f_{DIGCLK}$) and multiplying the first clock signal (REFCLK) by means of a clock signal multiplication circuit (25-1) so as to produce a second clock signal (DIGCLK) which has a frequency at least as high as the first frequency ($f_{DIGCLK}$) and which is phase-locked with respect to the first clock signal (REFCLK).

In one embodiment, the multiplying is performed by means of a clock signal multiplication circuit (25-1) that includes an oscillator (6) and a counter circuit (12) clocked by an oscillator clock signal (CLK) produced by the oscillator (6), wherein the counter circuit (12) samples its contents in response to the first clock signal (REFCLK), wherein the clock signal multiplication circuit (25-1) also includes a clock filter and clock period estimator circuit (15-1) coupled to receive the sampled contents (CNT) of the counter circuit (12). The method includes producing an estimate (Mbar), which is representative of the period of the first clock signal (REFCLK) multiplied by a ratio (K) of the first frequency ($f_{DIGCLK}$) to the second frequency ($f_{REF}$) by means of the clock filter and clock period estimator circuit (15-1), producing a predetermined number of integer representations (M) of the estimate (Mbar) by means of a delta-sigma modulator (20-1), entering the predetermined number of integer representations (M) into a memory (22) for receiving and dividing the oscillator clock signal (CLK) by each the integer representation (M) from the memory (22) to generate a pulse (of DIGCLK) which lasts during a number of cycles of the oscillator clock signal (CLK) equal to the value of that integer representation (M). The oscillator clock signal (CLK) is generated by means of a free-running oscillator.

In one embodiment, the method includes initially calibrating the oscillator (6) to a predetermined frequency such that the oscillator clock signal (CLK) is not synchronized with respect to the first clock signal (REFCLK) and then allowing the oscillator (6) to run freely.

In the described embodiments, the method includes providing the delta-sigma modulator with an architecture which ensurers that the second clock signal (DIGCLK) is phase-locked with respect to the first clock signal (REFCLK).

In one embodiment, the invention provides a circuit (1,1-1,2) for generating an output clock signal (PLLCLK or CLKOUT), including a phase locked loop (PLL) circuit (25) which requires a reference clock signal of at least a predetermined first frequency ($f_{DIGCLK}$) and produces the output clock signal (PLLCLK or CLKOUT) in response to an output of the PLL circuit (25), means (25-1) for multiplying a first clock signal (REFCLK) of a second frequency ($f_{REF}$) that is substantially lower than the first frequency ($f_{DIGCLK}$) so as to produce a second clock signal (DIGCLK) which has a frequency at least as high as the first frequency ($f_{DIGCLK}$) and which is phase-locked with respect to the first clock signal (REFCLK), means for applying the second clock signal (DIGCLK) to a reference signal input of the PLL circuit (25), and means (26,27) for producing the clock output signal (CLKOUT) in response to an output signal (PLLCLK) produced by the first PLL (25).

BRIEF DESCRIPTION OF THE DRAWINGS

FIG. 2A is a block diagram of a clock filtering and clock divide ratio estimator circuit which may be used in block 15-1 of FIG. 1A.

FIG. 2B is a block diagram of a clock filtering and clock divide ratio estimator circuit which may be used in block 15-2 of FIG. 1B.

FIG. 4A is a flow chart of the operation of the audio clock signal generation system of FIG. 1A.

FIG. 4B is a flow chart of the operation of the audio clock signal generation system of FIG. 1B.

DETAILED DESCRIPTION OF THE PREFERRED EMBODIMENTS

The present invention provides a circuit and method for generating audio operating clock signals normally used by audio coder/decoders and interface devices based on low frequency reference clock signals, less than roughly 1 kHz.

Figure 1:
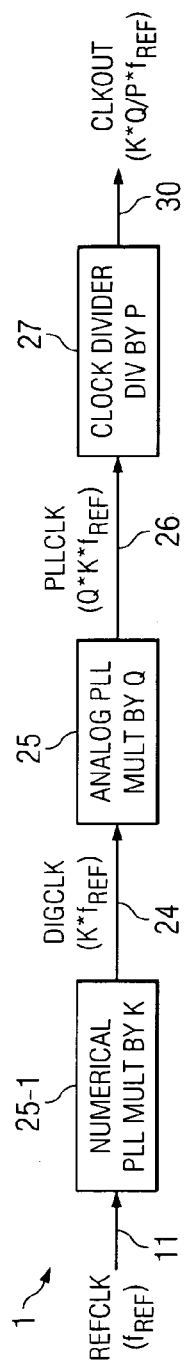
FIG. 1 is a simplified block diagram of a clock generator of the present invention.

FIG. 1 shows an audio clock signal generator 1 in which a reference clock signal REFCLK is connected via a conductor 11 to an input of a "Numerical PLL" circuit 25-1 to perform a multiply-by-K function. (The term "Numerical PLL" as used herein refers to circuitry which is entirely or mainly digital circuitry used to operate on the edges of REFCLK and the digital information on bus 3 of FIG. 1A or 1B.) Numerical PLL 25-1 produces a digital clock signal DIGCLK of frequency $K*f_{REF}$ on conductor 24, which is applied to the input of an analog PLL 25-2. Analog PLL 25-2 performs a multiply-by-Q function to produce a signal PLLCLK of frequency $Q*K*f_{REF}$ on conductor 26, which is applied to the input of an optional clock divider circuit 27-1. Clock divider circuit 27-1 performs a divide-by-P function to produce an output clock signal CLKOUT of frequency $K*Q/P*f_{REF}$ on output conductor 30.

As previously mentioned, if the reference clock signal REFCLK is too slow for a PLL it is likely to become unstable. In accordance with the present invention, the "phase-locked frequency multiplier circuit", referred to in FIG. 1 as "Numerical PLL" 25-1, operates digitally in response to a digital control signal SETTING so as to modify the slow, low frequency reference clock REFCLK so as to generate the faster clock DIGCLK in such a way that DIGCLK is both proportional to and phase-locked with respect to REFCLK, and also is fast enough to ensure that analog PLL 25-2 will not be unstable, wherein the low frequency reference clock REFCLK can be "free-running", i.e., independent of CLKOUT, and wherein the higher frequency signal DIGCLK is phase-locked to the low frequency clock signal REFCLK that is generated using a free-running on-chip oscillator clock.

Figure 1A:
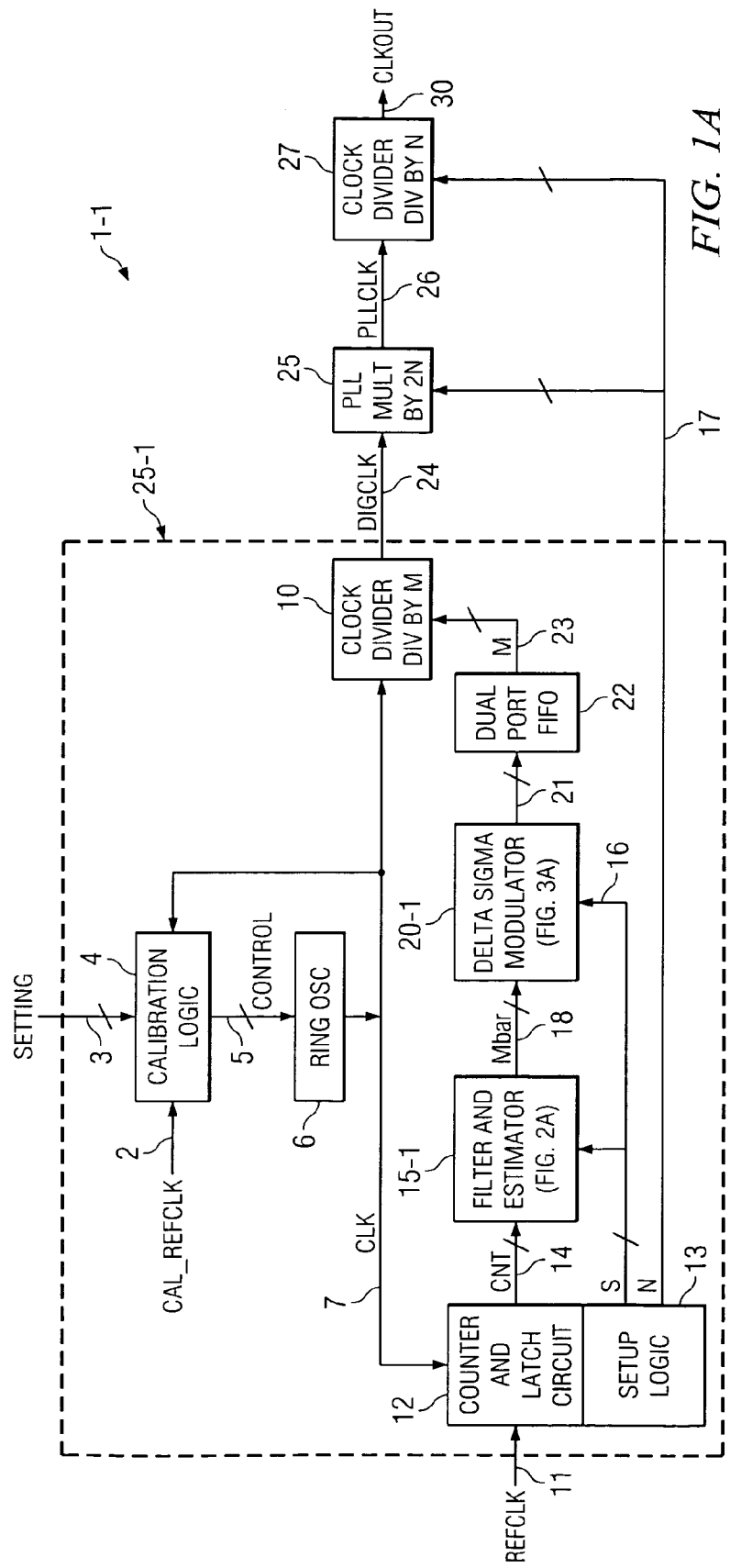
FIG. 1A is a more detailed block diagram of the clock generator of FIG. 1.

Referring to FIG. 1A, audio clock signal generator 1-1 includes a counter and latch circuit 12 which receives reference clock signal REFCLK on conductor 11. Counter and latch circuit 12 also receives a clock signal CLK on conductor 7, which is connected to the output of a free-running, programmable ring oscillator circuit 6. It is necessary to initially calibrate free-running oscillator 6. The input of oscillator 6 receives a control signal on bus 5, which is connected to the output of calibration logic in block 4. The calibration word "SETTING" on digital bus 3 is applied to a digital input of calibration logic 4. A calibration reference clock signal CAL_REFCLK on conductor 2 is applied to an input of calibration logic 4. CAL_REFCLK is a clock signal with a known frequency and can be a low speed or a high speed clock signal. The calibration word "SETTING" sets the multiplying factor for CAL_REFCLK to achieve the desired frequency of oscillator clock CLK.

During the calibration operation, the signal CLK on conductor 7 is in effect fed back to calibration logic 4. With enough tuning resolution of oscillator 6, CLK can be calibrated with a predetermined accuracy. After the calibration is complete, the feedback of CLK to the calibration logic in block 4 is internally interrupted, and oscillator 6 then runs freely in an open loop mode at approximately the desired frequency established by the calibration operation. Power supply, oscillator circuit, and temperature variations will cause normal drift of the frequency of CLK. The nominal oscillator clock frequency in one embodiment of the invention is 1024*48 kHz=49.152 MHz.

Oscillator clock signal CLK is applied to the input of a clock divider circuit 10, which performs a divide-by-M function. The period, or equivalently the frequency, measurement, of REFCLK is used to generate the high frequency clock signal DIGCLK, which is provided as a clock input to analog PLL 25. PLL 25 filters out most of high frequency jitter of DIGCLK. Since PLL 25 can only operate for a certain frequency range of its clock signal input, the operating frequency of CLK has to be preset by the above mentioned calibration to a value such that the average frequency of DIGCLK divided from CLK can be within that certain frequency range.

Counter and latch circuit 12 produces an output signal CNT on digital bus 14, which is connected to the input of a "clock filtering and clock divide ratio estimator" circuit 15-1, details of which are shown in subsequently described FIG. 2A. Clock filtering and clock divide ratio estimator circuit 15-1 produces an output signal Mbar on bus 18, which is connected to the input of a delta-sigma modulator 20-1, details of which are shown in subsequently described FIG. 3A. Mbar provides an estimate of the period (or equivalently, the frequency, which is the inverse of the period) of REFCLK after it is multiplied by K. That is, Mbar is the period of DIGCLK measured by counting the number of pulses of CLK produced by free-running oscillator 6.

A set up logic circuit 13 produces a shift factor S on bus 16, which is connected to frequency multiplication factor inputs of both clock filtering and clock divide ratio estimator circuit 15-1 and delta-sigma modulator 20-1, where $K=2^S$. Setup logic 13 also generates a digital number N on bus 17, which is connected to a divide input of PLL 25 and a multiply input of divider 27. The output of delta-sigma modulator 20-1 is produced on bus 21, which is connected to the input port of a dual port FIFO (first in, first out) memory 22. The output port of dual port FIFO 22 is a digital signal M on bus 23, which is connected to the divide input of clock divider 10. Set up logic 13 in FIG. 1A preferably operates in response to REFCLK and CNT in such a way that even though the frequency of oscillator clock signal CLK may undergo normal drift, there is no corresponding drift of shift factor S and PLL multiplier N. The logic circuitry in setup logic 13 can be straightforward and readily implemented by those skilled in the art.

The output DIGCLK of clock divider 10 is coupled by conductor 24 to the input of PLL 25, which performs a multiply-by-2N function. The output of PLL 25 is produced on conductor 26, which is applied to the input of an optional clock divider circuit 27 which has a divide input that receives the digital number N on bus 17. Clock divider 27 produces the output clock signal CLKOUT on conductor 30.

Counter and latch circuit 12 includes a dedicated "first" counter (not shown) for counting the number of CLK cycles within one or multiple REFCLK cycles to estimate the period/frequency of REFCLK. (That is, the "first" counter is the "latches" portion of counter and latch circuit 12.) S and N are set on the basis of this estimate. During normal operation, the above mentioned dedicated counters continuously count the cycles of CLK to monitor the frequency of REFCLK. The settings will not be changed by normal drifting of the frequency of the free-running oscillator clock of CLK, but a certain amount of frequency change of REFCLK triggers re-setup of S and N such that the clock generating system can adjust to a frequency change of REFCLK. A "second" counter (which is not shown, but is the "counter" portion of contained in counter and latch circuit 12) continuously increments its value by 1 for every cycle of CLK without ever being reset, for the purpose of generating CNT.

Oscillator clock signal CLK is used to measure the period/frequency of REFCLK using counter and latch circuit 12, as follows. Each time the positive edge of REFCLK arrives, it causes the present oscillator clock count CNT to be sampled. The frequency of REFCLK can have a large range of values, and it is not related to CAL_REFCLK. Set up logic 13 determines values of S and N, based on the previously mentioned "first" counter value, and CNT is generated from the previously mentioned "second" counter for the normal operation. Each REFCLK pulse results in one CNT value. That value of CNT is temporarily latched into the latch portion (not shown) of counter and latch circuit 12. The sampled counter values CNT are processed by clock filtering and clock divide ratio estimator circuit 15-1 of FIG. 2A to produce a value of the REFCLK period estimate Mbar, which is the period estimate of REFCLK multiplied by $2^S$, and which is a fractional number. The fractional number Mbar then is input to delta-sigma modulator 20-1 of FIG. 3A, which converts Mbar to integers that are averaged over time so as to be equal to Mbar. Delta-sigma modulator 20-1 operates I times on this same value of Mbar, where $I=2^S$. Each value of Mbar is converted to the predetermined number integers M by delta-sigma modulator 20-1. Delta-sigma modulator 20-1 thus generates I values, which are entered into FIFO 22. When FIFO 22 is half full (so as to provide equal chances for FIFO overflow and underflow), the data in FIFO 22 is entered into the divide input of clock divider 10. For example if M is equal to 4, then clock divider 10 generates one pulse for every 4 CLK cycles.

The output of clock divider 10 is applied as an input to PLL 25. The edges of DIGCLK produced by clock divider 10 are subject to jitter because the REFCLK period estimate has gone through delta-sigma modulator 20-1. This causes the edges of its output signals to have a substantial amount of high frequency jitter. Analog PLL 25 has a low-pass filtering effect that smooths the jitter of the output DIGCLK of clock divider 10, and in this example PLL 25 also multiplies DIGCLK by 2N. Then, depending on the desired frequency of CLKOUT, optional clock divider 27 can be provided for convenience to divide down the frequency of the output produced on conductor 26 by PLL 25.

In FIG. 2A, clock filtering and clock divide ratio estimator circuit 15-1 of FIG. 1A includes an adder 31 having a (+) input which receives the latched counter signal CNT on bus 14 and a (−) input connected to a bus 54. The output 32 of adder 31 is connected to the input of a multiplier or gain circuit 33 which multiplies the difference signal on bus 32 by a preset gain K1 and presents the result on bus 34. Bus 34 is connected to one input of a digital adder 35 and to the input of a multiplier or gain circuit 36 which multiplies the value on bus 34 by a gain K2 to generate the result on bus 37. Bus 37 is connected to one input of a digital adder 40, the output 41 of which is connected to the input of a register 42. The output of register 42 is coupled by a bus 43 to another input of adder 35 and also is fed back to another input of digital adder 40. The output of adder 35 digital is coupled by bus 44 to a right-shift circuit 45 which performs a right-shift function. An input of right-shift circuit 45 receives the shift factor S on bus 16. The output of right-shift circuit 45 produces Mbar, which is the estimate of the period of DIGCLK. Bus 18 is also connected to the input of a left-shift circuit 47, which performs a left-shift-by-S function. The shift input of left-shift circuit 47 receives shift factor S on bus 16. The output of left-shift circuit 47 is coupled by bus 50 to one input of a digital adder 51, the output of 52 of which is connected to the input of a register 53. Adder 51 and register 53 form accumulator which is a part of the filter and estimator circuit 15-1 shown in FIG. 2A. The output of register 53 is connected to bus 54, which also is connected to another input of adder 51.

The multiplication ratio K (see FIG. 1) for the case shown in FIG. 1A is equal to $2^S$. Referring to FIG. 2A, the right-shifting of the binary data by S bits in block 45 of clock filtering and clock divide ratio estimator circuit 15-1 of FIG. 2A accomplishes division by $2^S$ of the sum produced by digital adder 35 on bus 44 in order to obtain the fractional value Mbar on bus 18, and that value is entered I times into delta-sigma modulator 20-1, where $I=2^S$. After the right-shifting in block 45 of FIG. 2A, the value Mbar is left-shifted by S bits and then fed back through digital adder 51, register 53, and bus 54 to the (−) input of digital summer 31. Although this feedback via digital adder 51 and register 53 (which form an accumulator that is a part of the whole filter shown in FIG. 2A), and bus 54 is from the input, rather than the output, of delta-sigma modulator 20-1 (FIG. 1A), the architecture of delta-sigma modulator 20-1 limits the error between the output of delta-sigma modulator 20-1 and the digital value on conductor 54 in FIG. 2A. (The reason that the feedback can be generated from Mbar by left-shifting S bits, equivalent to multiplying by $I=2^S$, instead of performing accumulation of the output of delta-sigma modulator 20-1 "I" times, is that the second order architecture of delta-sigma modulator 20-1 ensures that the error between the accumulation of the output of delta-sigma modulator 20-1 and the digital value on conductor 54 in FIG. 2A on average is zero over the time which would be required to perform the above mentioned accumulation of the output of delta-sigma modulator 20-1). This is very important because if the error were to keep accumulating over time, the error in the output of delta-sigma modulator 20-1 also would keep accumulating, and then the generated clock signal CLKOUT and REFCLK would not be phase-locked.

Counter and latch circuit 12 includes the previously mentioned "second" counter, which can be a 24-bit counter that is driven by oscillator clock CLK. The content of the "first" counter portion of counter and latch circuit 12 continuously increases by 1 at every pulse of CLK. A positive edge of REFCLK latches the counter data into the temporary register or latch portion of counter and latch circuit 24, which is the previously mentioned "second" counter. REFCLK has to be re-aligned with the oscillator clock CLK before the latching. (This re-alignment is required for reliable operation because the above mentioned "second" counter (not shown) included in counter and latch circuit 12 driven by CLK toggles at every edge of CLK, and that counter is necessarily sampled after its content has settled, rather than in the middle of a transition from one value to the next to get the correct value. The latched data CNT temporarily stored in the latch portion of counter and latch circuit 12 is fed to the input of clock filter and clock period estimator circuit 15-1 in FIG. 2A.

Gain K1 indicated in block 33 and gain K2 indicated in block 36 of FIG. 2A are pre-determined for the desired filtering effect in accordance with the shift factor S set by setup logic 13 in FIG. 1. Shift factor S and PLL multiplier factor N are determined by the period/frequency measurement result CNT from the previously mentioned "second" counter portion of counter and latch circuit 12. There are total 9 setup "gears" for the REFCLK frequency range from 20 kHz to 216 kHz. (The term "gears" is commonly used in this manner to describe the operation of digital divider circuitry to provide multiple clock frequency ratios, because of the analogy to operation of an automobile transmission.) There are overlaps of the REFCLK frequencies measured by the oscillator clock CLK between neighboring setup gears to provide some "hysteresis" for the gear shifting. The overlaps are large enough to accommodate the overall combined drift of REFCLK and CLK. The pre-determined values of the shift and multiplier factors S and N are assigned to each gear. A proper gear is selected based on the present REFCLK period/frequency measurement, and the S and N values are set based on the selected gear. The frequency of REFCLK is monitored continuously, and a new gear will be switched to when a period/frequency measurement result is outside of the current gear covering range. In one embodiment of the invention, the shift factor S has the values of 6, 7 or 8 corresponding to 64, 128 or 256 multiples of REFCLK which provide the frequency of the digitally generated PLL reference clock signal DIGCLK. The filtering operation by clock filter and clock period estimator circuit 15-1 occurs once for every cycle of REFCLK.

Figure 3A:
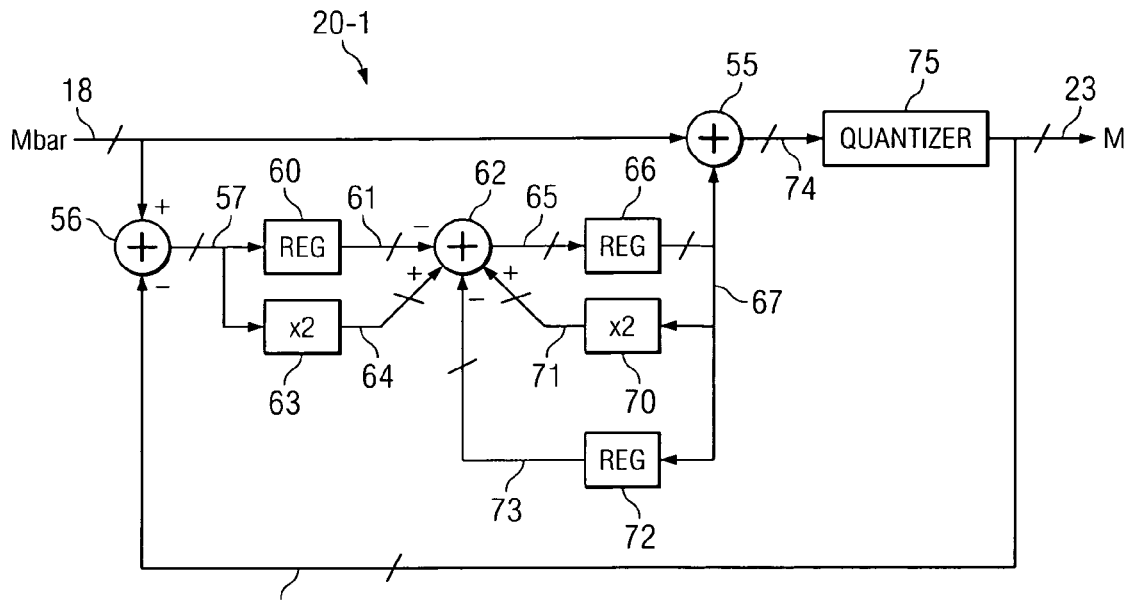
FIG. 3A is a block diagram of a delta-sigma modulator which may be used in block 20-1 of FIG. 1A.

In FIG. 3A, delta-sigma modulator 20-1 of FIG. 1A receives the estimate value Mbar on bus 18, with the estimated period of REFCLK divided by $I=2^S$. Mbar is coupled to the (+) input of digital summer 56 and to one input of digital adder 55. The output of adder 55 is coupled by bus 74 to the input of a quantizer 75, the output of which produces the integer M on bus 23, which also is coupled to the (−) input of digital summer 56. The output of digital summer 56 is coupled by bus 57 to the input of a register 60 and to the input of a multiplier 63 which performs a multiply-by-2 function. The output 61 of register 60 is connected to a first (−) input of digital summer 62, and the output 64 of multiplier 63 is coupled to the corresponding (+) input of digital summer 62. The output 65 of summer 62 is connected to the input of a register 66, the output 67 of which is coupled to another input of digital adder 55, to the input of another multiplier 70 which performs a multiply-by-2 function, and to the input of another register 72. The output 71 of multiplier 70 is connected to another (+) input of digital summer 62 and the output of register 73 is coupled to a corresponding (−) input of digital summer 62.

Delta-sigma modulator 20-1 of FIGS. 1A and 3A "grabs" the period estimate outputs Mbar from the clock filtering and clock period estimator circuit 15-1 and converts them into integers M that will be used by clock divider 10 of FIG. 1A to generate the PLL input clock DIGCLK on conductor 24. Delta-sigma modulator 20-1 operates 64, 128 or 256 times (i.e., $2^S$ times) for each value of Mbar it receives from clock filtering and clock divide ratio estimator circuit 15-1, depending on the values of S. The integer output values M produced by delta-sigma modulator 20-1 then are entered into dual port FIFO 22. (Note that S does not appear as an input to delta-sigma modulator 20-1 because delta-sigma modulator 20-1 is set up in a conventional manner so as to perform $I=2^S$ clock cycles for each value of Mbar.)

In operation, clock divider 10 of FIG. 1A "grabs" the next available integer M from dual port FIFO 22 and generates a single clock pulse of DIGCLK during M clock cycles of oscillator clock CLK. Then clock divider 10 grabs the next value of integer M from FIFO 22 and generates another single pulse of DIGCLK for that number M of clock cycles of CLK, and so forth.

PLL 25 then receives the "jittery" DIGCLK pulses on conductor 24 and produces its output signal PLLCLK on conductor 26, with a frequency 2N times the frequency of DIGCLK, where N is chosen measured by means of the previously described REFCLK period estimate based on oscillator clock CLK. Since PLL 25 has low pass characteristics, most of the high frequency input clock jitter generated by the delta sigma modulation will be filtered out.

The PLL clock output PLLCLK on conductor 26 then is divided by N (by P in general, or by N if it is desired that the frequency of the output clock CLKOUT be a power of 2 times the frequency of the input reference clock signal REFCLK) by means of optional clock divider 27. As result, the frequency of CLKOUT at the output of clock divider 27 is 128, 256 or 512 times of frequency of REFCLK in the foregoing example when P (see block 27 of FIG. 1) is set as N.

Referring to the flowchart of FIG. 4A, the first step in the operation of clock generator circuit 1-1 of FIG. 1A is to calibrate oscillator 6, as indicated in block 86. Then the period or frequency of REFCLK is estimated and the values of shift factor S and PLL multiplication factor N are determined, as indicated in block 87. The next step is to wait for the next positive edge of REFCLK, as indicated in block 88. When that occurs, the latch (i.e., "first" counter portion) of counter and latch circuit 12 latches and then outputs CNT, as indicated in block 89. Clock filtering and clock divide ratio estimator circuitry 15-1 then produces Mbar, which is the present average period estimate of DIGCLK, as indicated in block 90. Then, as indicated in block 91, delta-sigma modulator 20-1 operates on Mbar I=$2^S$ times. That number $2^S$ of delta-sigma modulator output values M are entered into FIFO 22, as indicated in block 92. The process then returns to block 88 and waits for the next positive edge of REFCLK.

When it is determined by decision block 93 that FIFO 22 is half full (the "threshold" referred to in decision block 93 is equal to one half of the FIFO size), a "yes" determination causes clock divider 10 to divide CLK by M, as indicated in blocks 95 and 96. (For example, if M is equal to 4, clock divider 10 will generate one output pulse after 4 pulses of CLK have been generated.) After generating one pulse, the process returns to block 95 and FIFO 22 "grabs" the next value of M from FIFO 22 and clock divider 10 continues to produce the next pulse of DIGCLK. It should be appreciated that the feedback architecture shown in FIG. 1A prevents both underflow and overflow conditions from occurring, assuming a reasonable size of FIFO 22.

Figure 1B:
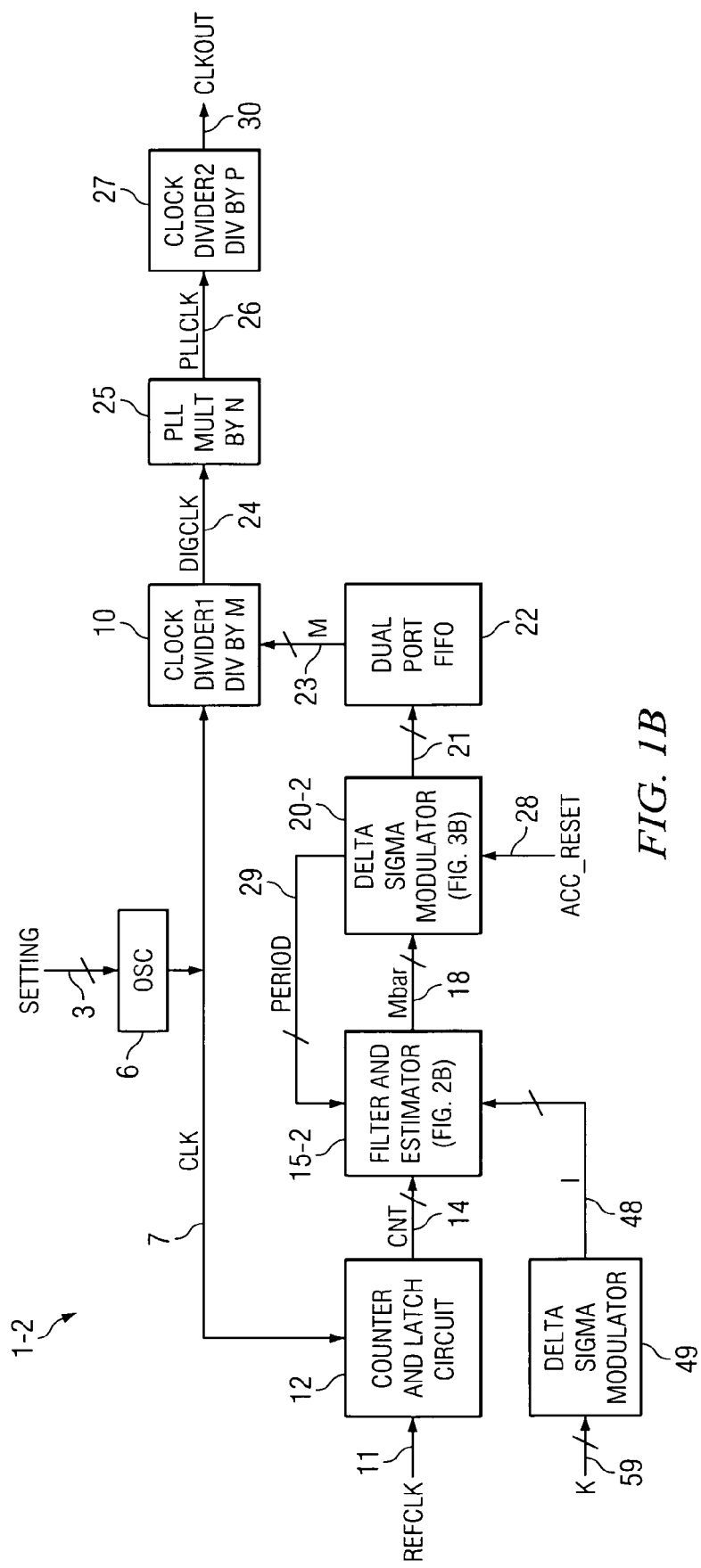
FIG. 1B is a block diagram of a variant of FIG. 1A.
Figure 3B:
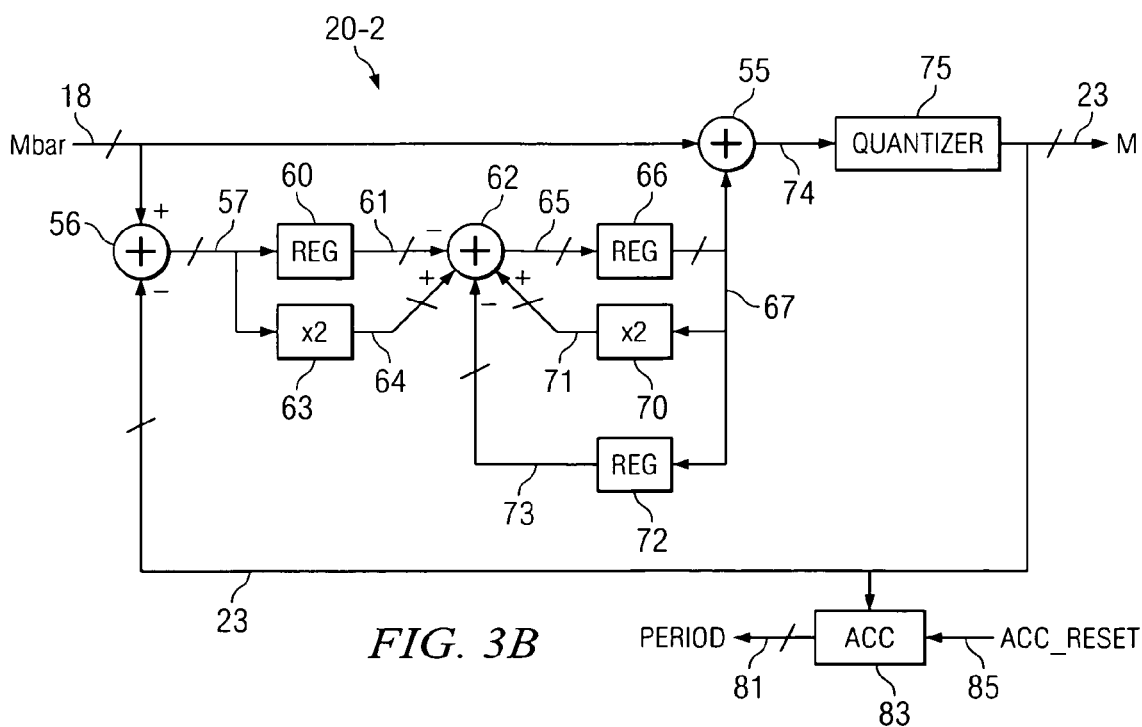
FIG. 3B is a block diagram of a delta-sigma modulator which may be used in block 20-2 of FIG. 1B.

FIG. 1B shows an audio clock signal generator 1-2 which is similar to audio clock signal generator 1-1 of FIG. 1A except that set up logic 13 of FIG. 1A is replaced in FIG. 1B by an additional delta-sigma modulator 49 which receives the ratio value K (see block 25-1 of FIG. 1) on bus 59, and produces the value "I" on bus 48 which is applied to a frequency multiplier factor input of clock filtering and clock divide ratio estimator circuit 15-2. Details of clock filtering and clock divide ratio estimator circuit 15-2 are shown in FIG. 2B. Clock filtering and clock divide ratio estimator circuit 15-2 produces the estimate of Mbar on bus 18, which is applied to an input of delta-sigma modulator 20-2, details of which are shown in FIG. 3B. (As previously explained, Mbar is the period of DIGCLK measured by counting the number of pulses of CLK produced by free-running oscillator 6.) A reset signal ACC_RESET is applied to a reset input of delta-sigma modulator 20-2. A signal "PERIOD" is fed back from delta-sigma modulator 20-2 via conductor 29 to a period feedback input of clock filtering and clock divide ratio estimator circuit 15-2. Delta-sigma modulator 20-2 produces an integer output M on bus 21 which is applied to an input of dual port FIFO 22, which can be the same as in FIG. 1A. The calibration logic 4 of FIG. 1A is omitted from FIG. 1B, and instead the value SETTING is applied by bus 3 directly to a control input of digitally controllable ring oscillator 6. The rest of audio clock signal generator 1-2 in FIG. 1C is the same as in FIG. 1B.

In FIG. 2B, clock filtering and clock divide ratio estimator circuit 15-2 of FIG. 1B is similar to clock filtering and clock divide ratio estimator circuit 15-1 of FIG. 2A, except that right-shift circuit 45 is replaced by a divider circuit 76 which performs a divide-by-I function. (As indicated above, if K (see block 25-1 in FIG. 1) is fractional, then K is converted to an integer I by delta-sigma modulator 49; otherwise K is equal to I.) The data input of divider 76 in FIG. 2B is connected to bus 44, and the divide input of divider 76 receives the digital word I on bus 77. The output of divider 76 produces Mbar on bus 18. Left-shift circuit 47 of FIG. 2A also is omitted from clock filtering and clock divide ratio estimator circuit 15-2 of FIG. 2B. The signal PERIOD on bus 81 is applied to one input of digital adder 79, the output of which is connected to bus 54. Bus 54 also is connected to the input of a register 80, the output of which is connected to another input of digital adder 79. Adder 79 and register 80 form an accumulator.

In FIG. 3B, delta-sigma modulator 20-2 is the same as delta-sigma modulator 20-1 of FIG. 3A but further includes accumulator 83, which has an input that receives the integer value M on bus 23, and produces the above mentioned signal PERIOD on bus 81. Accumulator reset signal ACC_RESET on bus 85 resets accumulator 83.

Slightly modified implementations of clock filtering and clock divide ratio estimator circuit 15-2 and delta-sigma modulator 20-2 are used in FIG. 1B, since the value of K is not necessarily a power of 2 and the binary shifting in blocks 45 and 47 therefore is not applicable. For clock generation system 1-2 of FIG. 1B, the user directly sets up the ratio K which is needed to be multiplied by the frequency of REFCLK in order to cause DIGCLK to be in the frequency range acceptable by analog PLL 25 so that the desired frequency of CLK-OUT is generated. The frequency of REFCLK is known and the required frequency of CLKOUT also is known; therefore the desired ratio between REFCLK and CLKOUT also is known. (Note that the entire architectures of clock filter and period estimator circuits 15-1 and 15-2 perform the period estimate, along with a low pass filtering effect. That is, the high frequency noise components existing REFCLK and the jitter in the oscillator clock CLK are filtered out by the architectures in 15-1 and 15-2 to obtain Mbar, the estimate of the period of DIGCLK.)

As indicated in FIG. 1, the frequency of CLKOUT is K*Q/P*$f_{REF}$, so values of K, Q, and P can be based on this formula. The feedback to digital summer 30-1 in FIG. 2B comes from the output of delta-sigma modulator 20-2, rather than from the delta-sigma modulator input as in FIG. 2A. In FIG. 2B, the value of K can be a fractional number, and this fractional number is applied as an input to the delta-sigma modulator 49 in FIG. 1B, and is converted into the integer I. In FIG. 1B, REFCLK samples the value of CNT in counter and latch circuit 12 and latches CNT into the latch portion thereof. The counter portion continues to count in response to CLK.

CNT is entered into digital summer 31 of clock filtering and clock divide ratio estimator circuit 15-2. The filtered output of digital summer 35 is divided by the integer I in block 76 to produce Mbar, since I is not necessarily a power of 2. Mbar is applied via bus 18 to the input of delta-sigma modulator 20-2 of FIG. 3B. Accumulator 83 in FIG. 3B is reset before delta-sigma modulator 20-2 begins to process Mbar for the present value of CNT. Accumulator 83 accumulates the values of M produced by delta-sigma modulator 20-2 while Mbar is processed I times by delta-sigma modulator 20-2. After M has been accumulated I times by accumulator 83, the accumulated number PERIOD is fed back into digital summer 31 through digital summer 79. The number in register 80 plus the value of PERIOD is equal to the feedback value on bus 54. The value on bus 54 waits for the next pulse of reference clock REFCLK to sample and latch the output CNT of counter and latch circuit 12 and then subtract it from the sampled value of CNT. Thus, PERIOD is generated from the current value of CNT. Then, when the new value of CNT is latched by the next arriving edge of REFCLK, the value of PERIOD is subtracted from the new value of CNT in the process of generating the new value of a Mbar.

As in FIG. 1A, the output of delta sigma modulator 20-2 is entered into FIFO 22, and when it has a predetermined number of samples of M equal to half of the size of FIFO 22 from delta-sigma modulator 20-2, clock divider 10 operates to divide CLK by the successive values of M "grabbed" from FIFO 22 in order to generate the pulses of DIGCLK as the input for PLL 25. PLL 25 filters the high frequency jitter of DIGCLK to thereby provide a more periodic clock signal PLLCLK on conductor 26.

The flowchart of FIG. 4B is quite similar to the flowchart of FIG. 4A except that the steps for calibrating oscillator 6 are omitted. The first step in the process shown in the flowchart of FIG. 4B is to wait for the next pulse of REFCLK, as indicated in block 88. When the next pulse of REFCLK arrives, it causes the output CNT of counter and latch circuit 12 to be produced, as indicated in block 89. At the same time, delta-sigma modulator (DSM) 49 in FIG. 1B operates to convert K into an integer I if K is a fractional number, as indicated in block 89A. The signals produced by the operations in blocks 89 and 89A are processed by clock filter and clock period estimator circuit 15-2 to produce Mbar. Then accumulator reset pulse ACC_RESET resets accumulator 83 in FIG. 3B to 0, as indicated in block 90A. Delta-sigma modulator 15-2 operates on the same value of Mbar I times to generate the number I of its outputs. Because of the nature of the delta-sigma modulation, the output values may be different from each other. I values of M are entered into FIFO 22, as indicated in block 92A. The process then returns to block 88 and waits for the next pulse of REFCLK. When decision block 93 determines that I samples of M have been entered into FIFO 22 (when the FIFO is half full), then clock divider 10 is started, as indicated in block 94, and generates one output pulse of DIGCLK for every M cycles of oscillator clock CLK, as indicated in blocks 94, 95, and 96 of the flowchart of FIG. 4B. The present invention can be used by DACs for audio playback and also by ADCs (analog to digital converters) for audio recording, for example in audio codecs, which include both a DAC and ADC. The generated clock frequency required by such devices must be related to the sampling rate at which the audio information is recorded.

The overall signal flow, especially the technique of generating the clock DIGCLK signal at a frequency that will be tolerated by PLL 25, is substantially different than the prior art, and provides very good filtering of a the jitter of DIGCLK (to which some high performance audio devices otherwise may be very sensitive). Also, the described embodiments of the invention ensure that the generated audio operating clock CLKOUT is phased-locked to the input reference clock REFCLK. The way the feedback values are generated on bus 54 in both FIGS. 2A and 2B, along with the architecture of the delta-sigma modulator for case A, keeps CLKOUT phase-locked to the input reference clock REFCLK.

The above described embodiments of the invention generate a clock signal CLKOUT with a frequency related to a reference clock which can have a high or low frequency that an ordinary PLL cannot tolerate. For example, the reference clock frequency can be as low as several hundred Hertz up to 1 kHz, which has not been practical in the closest prior art. Furthermore, the phase of CLKOUT is locked with respect to the phase of REFCLK. That is very important because if the only frequency CLKOUT is locked to a particular value, but its phase is not locked over time with respect to the phase of REFCLK, the audio system will have overflow problems or underflow problems which cause distortion and popping sounds. That is, if the phase of CLKOUT "walks away" from the phase of REFCLK because they are not phase-locked together, then a phase error between them will accumulate over time, resulting in overflow or underflow.

It is believed that most comparable design applications utilize first order feedback systems to avoid instability of period estimates. In contrast, the above described embodiments of the invention shown in FIGS. 1A and 1B use second order feedback systems with two registers and are stable, although they are more complex, especially the embodiment shown in FIG. 1B wherein the delta-sigma modulator 20-2 is also included into the feedback. Although some prior art clock generators may be able to achieve the generated clock signal so it is phase-locked to a low frequency reference clock signal by using a digital circuit in front of the analog PLL, the phase-lock may not be reliable and may cause dropping or slipping of audio samples.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention. For example, the described embodiments of the invention are adapted to generate CLKOUT with a frequency that is a 512, 256 or 128 multiple of the frequency of REFCLK, which ranges from 20 kHz to 216 kHz, with phase-locked operation and relatively easily met requirements for its rate estimator, delta-sigma modulator, clock divider circuit, and analog PLL. However, other embodiments of the invention can have different multiples of REFCLK and different "gear ratios" than those described above.

What is claimed is:

1. A clock signal generating system for generating an output clock signal comprising:
   a phase locked loop (PLL) circuit which requires a reference clock signal of at least a predetermined first frequency, an output of the PLL circuit being coupled to generate the output clock signal; and
   a clock signal multiplication circuit having:
      an oscillator;
      a counter circuit that is clocked by an oscillator clock signal produced by the oscillator and that is coupled to receive a first clock signal of a second frequency that is substantially lower than the first frequency, wherein the counter circuit samples its contents in response to the first clock signal;
      a clock filter and clock period estimator circuit that is coupled to receive the sampled contents of the counter circuit;
      a first delta-sigma modulator that is coupled to receive an estimate which is representative of the period of the first clock signal multiplied by a ratio of the first frequency to the second frequency, and which is produced by the clock filter and clock period estimator circuit for producing an integer representation of the estimate;
      a memory for receiving a predetermined number of the integer representations; and
      a first divider circuit coupled to divide the oscillator clock signal by the predetermined number of the integer representations to generate a second clock signal which has a frequency at least as high as the first frequency, wherein the output clock signal is phase-locked with respect to the first clock signal, and wherein a reference clock input of the PLL circuit is coupled to receive the second clock signal.

2. The clock signal generating system of claim 1, wherein the clock signal multiplication circuit further comprises set up logic for providing a shift factor for the clock filter and clock period estimator circuit and a PLL multiplier factor for the PLL circuit in response to the sampled contents.

3. The clock signal generating system of claim 1, wherein the memory further comprises a first in, first out (FIFO) circuit coupled between an output of the first delta-sigma modulator and a divide input of the first divider circuit.

4. The clock signal generating system of claim 1, wherein the clock filter and clock period estimator circuit further comprises low pass filtering and period estimating circuitry.

5. The clock signal generating system of claim 2, wherein the clock filter and clock period estimator circuit further comprises:
- a right-shift circuit having input coupled to receive the shift factor, and an output on which the estimate is produced; and
- a left-shift circuit which has an input coupled to receive the estimate, another input coupled to receive the shift factor, and an output coupled by an accumulator circuit to a digital summer which also receives the sampled contents.

6. The clock signal generating system of claim 5, wherein the first delta sigma modulator performs $2^S$ operations on the estimate, wherein S is the shift factor.

7. The clock signal generating system of claim 1, wherein the oscillator is a free-running oscillator.

8. The clock signal generating system of claim 1, wherein the clock signal multiplication circuit further comprises calibration circuitry for initially calibrating the oscillator to a predetermined frequency and then allowing the oscillator to run freely.

9. The clock signal generating system of claim 8, wherein the first delta sigma modulator has an architecture which ensures that the second clock signal is phase-locked with respect to the first clock signal.

10. The clock signal generating system of claim 2, wherein the clock signal multiplication circuit further comprises a second clock divider having an input coupled to an output of the PLL circuit and an output on which the output clock signal is produced.

11. The clock signal generating system of claim 1, wherein the oscillator is a programmable ring oscillator which receives a first control value that sets a nominal frequency of the oscillator clock signal which, after being divided by the first divider circuit, can be tolerated by the PLL circuit.

12. The clock signal generating system of claim 11, the clock signal multiplication circuit further comprises a second delta-sigma modulator which operates on a second control value to produce a digital value which is provided as a frequency multiplier factor input to the clock filter and clock period estimator circuit.

13. The clock signal generating system of claim 12, wherein the first delta sigma modulator further comprises an accumulator having an input coupled to an output of a quantizer which generates the integer representations, another input coupled to an accumulator reset signal, and an output which produces an estimate of a period of the first clock signal, the estimate of the period of the first clock signal being applied to a phase feedback accumulator input of the clock filter and clock period estimator circuit.

14. An apparatus comprising:
- a clock signal multiplication circuit having:
  - an oscillator that generates an oscillator signal;
  - a counter circuit that is clocked by the oscillator signal and that receives a reference clock signal;
  - a filter and estimator circuit that is coupled to the counter circuit;
  - a delta-sigma modulator that is coupled to the filter and estimator circuit, wherein the delta-sigma modulator produces a plurality of integer representations of an estimate of the period of the reference clock signal multiplied by a ratio of the frequency of the reference clock signal to a predetermined frequency;
  - a memory that is coupled to the delta-sigma modulator that stores the integer representations; and
  - a divider that divides the oscillator signal by the integer representations; and
- a PLL having a reference input that is coupled to the divider, wherein the predetermined frequency is a lower threshold frequency for the operation of the PLL.

15. The apparatus of claim 14, wherein the divider further comprises a first divider, and wherein apparatus further comprises a second divider that is coupled to the PLL.

16. The apparatus of claim 15, wherein the a clock signal multiplication circuit further comprises:
- set up logic that provides shift factor to the a filter and estimator circuit and the delta-sigma modulator and that provides a multiplier factor to the PLL and the second divider; and
- calibration logic that is coupled to the oscillator.

17. The apparatus of claim 15, wherein the memory is a FIFO memory.

18. A method comprising:
- producing an estimate that is representative of a period of a first clock signal multiplied by a ratio of a predetermined frequency to a frequency of the first clock signal;
- producing a plurality of integer representations of the estimate with a sigma-delta modulator;
- storing the integer representations in a memory;
- dividing an oscillator clock signal by each integer representation from the memory to generate a pulse which lasts during a number of cycles of the oscillator clock signal equal to the value of that integer representation so as to generate the second clock signal;
- receiving the second clock signal at a reference clock input of a PLL, wherein the predetermined frequency is a lower threshold frequency for the operation of the PLL; and
- generating an output clock signal with the PLL, wherein the output clock signal is phase-locked with respect to the first clock signal.

19. The method of claim 18, wherein the step of producing an estimate further comprises:
- sampling the first clock signal with a counter circuit that is clocked by the oscillator clock signal; and
- producing the estimate that is representative of a period of a first clock signal multiplied by a ratio of a predetermined frequency to a frequency of the first clock signal base at least in part on the sampling of the first clock signal.

20. The method of claim 19, wherein the method further comprises:
- generating a shift factor for the sigma-delta modulator; and
- generating a multiplier factor for the PLL.

* * * * *